(12) United States Patent
Shigetaka et al.

(10) Patent No.: US 9,173,285 B2
(45) Date of Patent: Oct. 27, 2015

(54) MOUNTING STRUCTURE FOR ELECTRONIC COMPONENT, INPUT DEVICE, AND METHOD OF MANUFACTURING MOUNTING STRUCTURE

(71) Applicant: ALPS ELECTRIC CO., LTD., Tokyo (JP)

(72) Inventors: Hiroshi Shigetaka, Miyagi-Ken (JP); Teruyasu Fukuyama, Miyagi-Ken (JP); Junichi Inamura, Miyagi-Ken (JP); Masashi Saito, Miyagi-Ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 297 days.

(21) Appl. No.: 13/892,659

(22) Filed: May 13, 2013

(65) Prior Publication Data
US 2013/0322032 A1    Dec. 5, 2013

(30) Foreign Application Priority Data

May 30, 2012   (JP) ................................. 2012-123616

(51) Int. Cl.
| H05K 1/00 | (2006.01) |
| H05K 1/02 | (2006.01) |
| G06F 3/041 | (2006.01) |
| H05K 3/36 | (2006.01) |
| H05K 3/32 | (2006.01) |

(52) U.S. Cl.
CPC .............. *H05K 1/0277* (2013.01); *G06F 3/041* (2013.01); *H05K 3/361* (2013.01); *H05K 3/323* (2013.01); *Y10T 156/10* (2015.01)

(58) Field of Classification Search
USPC ........... 361/760–790, 749–750; 174/254–260
See application file for complete search history.

(56) References Cited

U.S. PATENT DOCUMENTS

| 5,869,790 A |  | 2/1999 | Shigetaka et al. |
| 6,456,502 B1 | * | 9/2002 | Miller et al. ................... 361/760 |
| 7,851,708 B2 | * | 12/2010 | Sakai et al. .................... 174/255 |
| 8,947,368 B2 | * | 2/2015 | Jeong et al. .................... 345/173 |

FOREIGN PATENT DOCUMENTS

JP    2010-218535    9/2010

* cited by examiner

*Primary Examiner* — Tuan T Dinh
(74) *Attorney, Agent, or Firm* — Brinks Gilson & Lione

(57) ABSTRACT

An input device includes a flexible base, a sensor member that is provided on the surface of the flexible base and can detect the operation position of a finger, connection portions that are provided on a back of the flexible base, a printed circuit board of which an area is smaller than the area of the flexible base and which includes terminal portions on the surface thereof facing the back, and an electronic component that is mounted on a surface of the printed circuit board opposite to the surface of the printed circuit board on which the terminal portions are provided and is electrically connected to the terminal portions. The flexible base and the printed circuit board are bonded to each other with an adhesion layer interposed therebetween so that the connection portions come into contact with the terminal portions.

18 Claims, 6 Drawing Sheets

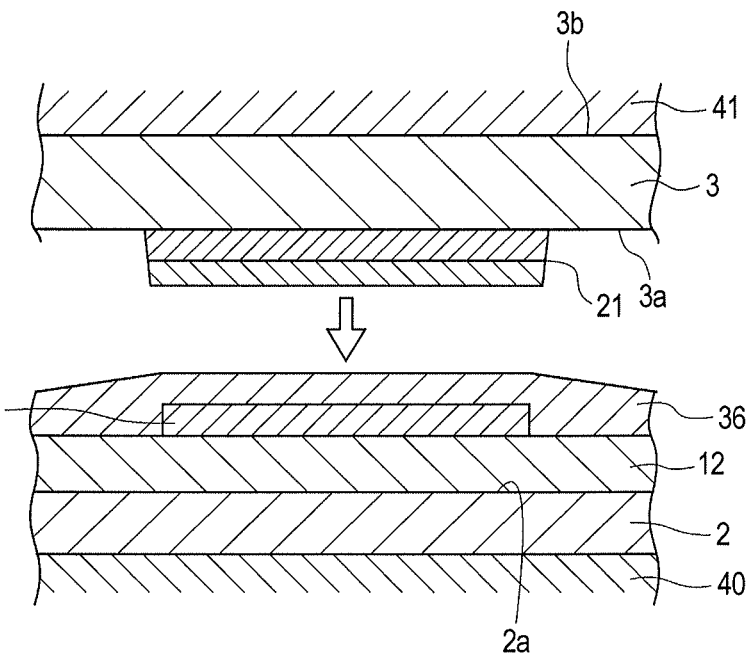
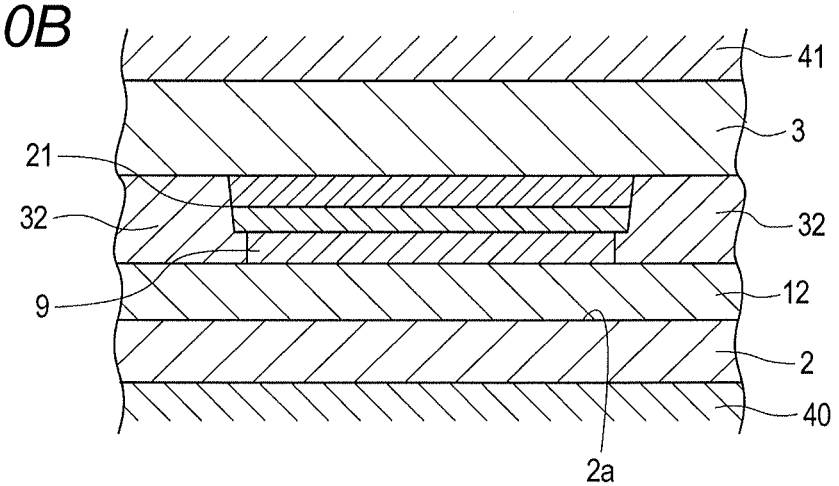

MOUNTING STRUCTURE FOR ELECTRONIC COMPONENT, INPUT DEVICE, AND METHOD OF MANUFACTURING MOUNTING STRUCTURE

CLAIM OF PRIORITY

This application claims benefit of priority of Japanese Patent Application No. 2012-123616 filed on May 30, 2012, which is hereby incorporated by reference in its entirety.

FIELD OF THE DISCLOSURE

The present disclosure relates to a mounting structure for an electronic component that is disposed on a flexible base, and an input device that includes the mounting structure and a sensor member and can detect an operation position.

DESCRIPTION OF THE RELATED ART

Japanese Unexamined Patent Application Publication No. 2010-218535 and Japanese Patent No. 3258209 disclose a structure where a sensor member is provided on one surface of a board and an electronic component is mounted on the other surface of the board.

In Japanese Patent No. 3258209, an electronic component is mounted on the back of a circuit board that is thicker than a film board of a sensor. However, it is possible to achieve a reduction in thickness and size by disposing a sensor member on one surface of a flexible base and mounting an electronic component on the other surface of the flexible base as in Japanese Unexamined Patent Application Publication No. 2010-218535. Further, for example, when the surface of a housing in which an input device is assembled is formed in a curved shape and the like since the flexible base is used, it is possible to dispose the flexible base so that the flexible base is curved along the curved shape.

In Japanese Unexamined Patent Application Publication No. 2010-218535, connection portions of the flexible base are bonded to lead frames of the electronic component by low melting point solder and the periphery of the bonded portions is covered with a resin. Alternatively, the connection portions are bonded to the lead frames by a conductive resin in which a conductive filler is mixed. In this case, a predetermined heat treatment is performed so that the connection portions are electrically connected to the lead frames.

However, in the structure where the electronic component is directly mounted on the flexible base by a conductive adhesive, the flexible base is exposed to high heat treatment temperature. For this reason, there is a problem in that the flexible base is affected by heat and is deformed.

SUMMARY

A mounting structure for an electronic component includes a flexible base, a connection portion that is provided on a first surface of the flexible base, a board of which an area is smaller than an area of the flexible base and stiffness is higher than the stiffness of the flexible base and which includes a terminal portion on the surface thereof facing the first surface, and an electronic component that is mounted on a surface of the board opposite to the surface of the board on which the terminal portion is provided and is electrically connected to the terminal portion. The flexible base and the board are bonded to each other with an adhesion layer interposed therebetween so that the connection portion and the terminal portion come into contact with each other.

In the aspect of the invention, the electronic component is mounted on the board of which the area is smaller than the area of the flexible base without being directly mounted on the flexible base. Accordingly, the flexible base is not affected by heat that is required for mounting the electronic component on the board. Further, in the aspect of the invention, the flexible base and the board are bonded to each other with an adhesion layer interposed therebetween so that the connection portion of the flexible base and the terminal portion of the board come into contact with each other. Since the connection portion and the terminal portion come into contact with each other as described above in the aspect of the invention, a conductive adhesive, which requires a high-temperature heat treatment to electrically connect the connection portion to the terminal portion, does not need to be used. Since the electronic component is not directly mounted on the flexible base and the board on which the electronic component has been mounted is bonded to the flexible base in the aspect of the invention, the board and the flexible base can be strongly compressed against each other as described in the following manufacturing method. Accordingly, it is possible to make the connection portion and the terminal portion come into contact with each other even though a conductive adhesive is not used. From the above description, in the aspect of the invention, it is possible to reduce thermal influence on the flexible base as compared to the related art. Accordingly, it is possible to suppress the deformation of the flexible base, which is caused by heat, as compared to the related art. Further, since the board overlaps a part of the flexible base, the flexibility of the flexible base does not deteriorate.

Further, according to another aspect of the invention, there is provided a method of manufacturing a mounting structure for an electronic component by using a flexible base that includes a connection portion provided on a first surface thereof, a board of which an area is smaller than an area of the flexible base and stiffness is higher than the stiffness of the flexible base and which includes a terminal portion on a surface thereof facing the first surface, and an electronic component. The method includes a step of electrically connecting the electronic component to the terminal portion by mounting the electronic component on a surface of the board opposite to the surface of the board on which the terminal portion is provided, a step of applying an adhesive to the first surface of the flexible base, and a step of bonding the board to the flexible base with an adhesion layer interposed therebetween by compressing the board against the flexible board so that the terminal portion of the board and the connection portion of the flexible base face each other and the connection portion comes into contact with the terminal portion.

BRIEF DESCRIPTION OF THE DRAWINGS

FIG. 10A is a view (partial longitudinal cross-sectional view) illustrating a process for manufacturing the mounting structure for an electronic component and the input device of this embodiment, and FIG. 10B is a view (partial longitudinal cross-sectional view) illustrating a process subsequent to the process of FIG. 10A.

DESCRIPTION OF THE EXEMPLARY EMBODIMENTS

Figure 1A:
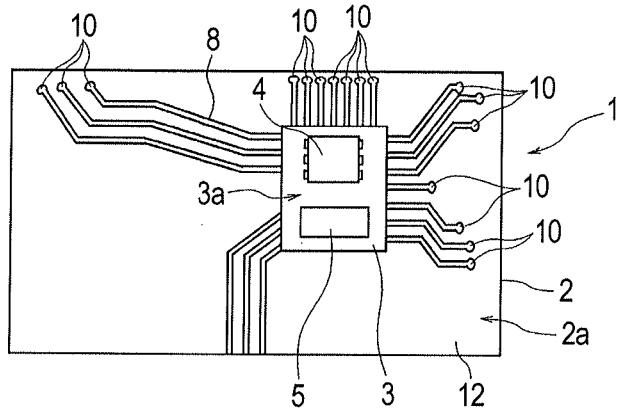
FIG. 1A is a view (back view) showing the structure on a first surface (back) of a flexible base of this embodiment.
Figure 1B:
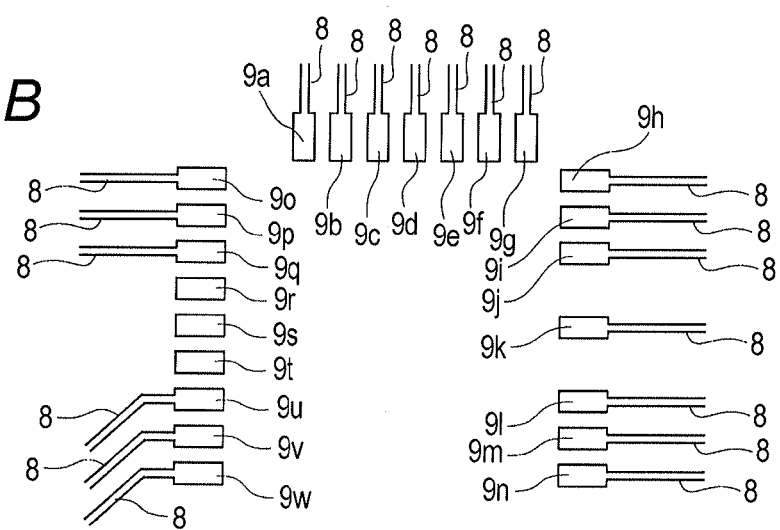
FIG. 1B is a partially enlarged view of connection portions and wiring portions that are formed on the first surface (back) of the flexible base shown in FIG. 1A.
Figure 1C:
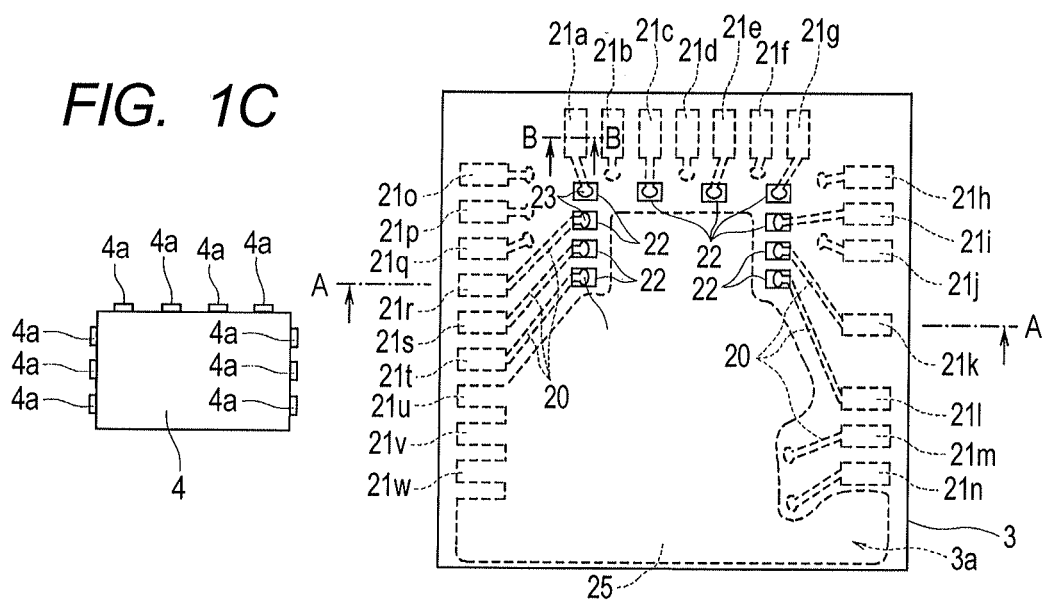
FIG. 1C is an enlarged view (in which terminal portions and wiring portions are shown by a dotted line) of a printed circuit board shown in FIG. 1A and an enlarged view of an electronic component.
Figure 2:
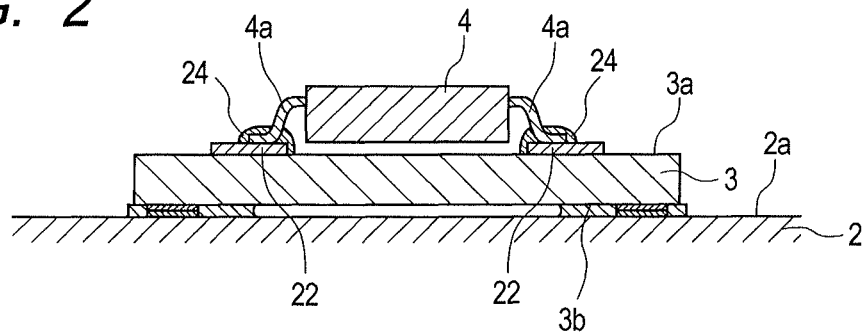
FIG. 2 is a partial longitudinal cross-sectional view of the electronic component and the printed circuit board.
Figure 3:
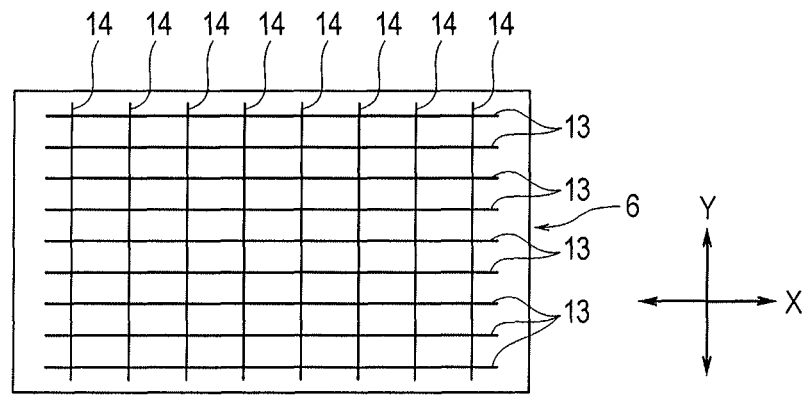
FIG. 3 is a plan view of a sensor member that is disposed on a second surface (surface) of the flexible base.

FIG. 1A is a view (back view) showing the structure on a first surface (back) of a flexible base of this embodiment, FIG. 1B is a partially enlarged view of connection portions and wiring portions that are formed on the first surface (back) of the flexible base shown in FIG. 1A, and FIG. 1C is an enlarged view (in which terminal portions and wiring portions are shown by a dotted line) of a printed circuit board shown in FIG. 1A and an enlarged view of an electronic component. Further, FIG. 2 is a partial longitudinal cross-sectional view of the electronic component and the printed circuit board, FIG. 3 is a plan view of a sensor member that is disposed on a second surface (surface) of the flexible base, and FIG. 4 is a partial longitudinal cross-sectional view of an input device of this embodiment.

An input device 1 of this embodiment includes a flexible base 2, a printed circuit board 3 (board) and electronic components 4 and 5 that are disposed on a first surface (back) 2a of the flexible base 2, and a sensor member 6 that is disposed on a second surface (surface) 2b of the flexible base 2. Meanwhile, FIGS. 1A, 1B, and 1C are back views seen from the back 2a of the flexible base 2. Further, the back 2a of the flexible base 2 faces the upper side in FIG. 2.

Figure 4:
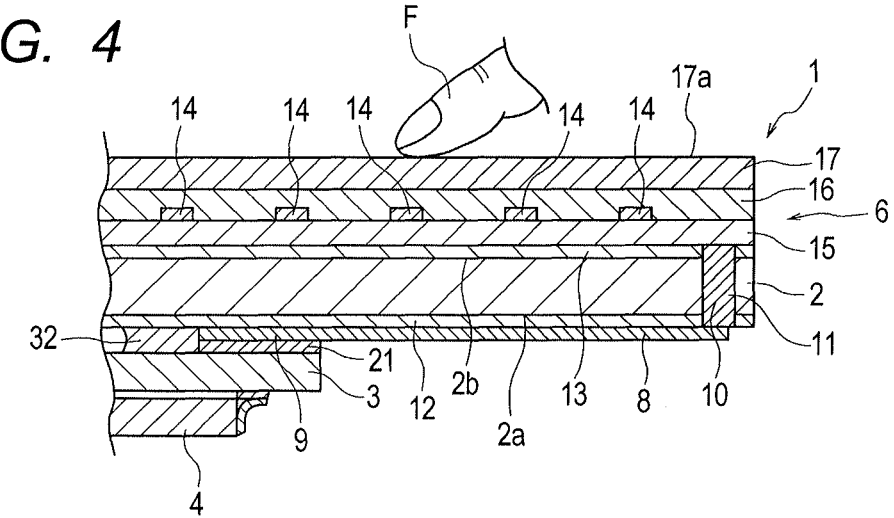
FIG. 4 is a partial longitudinal cross-sectional view of an input device of this embodiment.

An insulating layer 12 is formed on the back 2a of the flexible base 2 as shown in FIG. 4, a plurality of wiring layers 8 shown in FIGS. 1A and 1B are formed on the surface of the insulating layer 12, and one end portions of the wiring layers 8 form connection portions (connection pads) 9a to 9w. Further, end portions of the wiring layers 8 opposite to the connection portions 9a to 9w are connected to conductive layers 11 (see FIG. 4) filled in through holes 10 that are formed in the flexible base 2 so as to pass through the flexible base 2 in a thickness direction.

As shown in FIG. 1B, the width of each of the connection portions 9a to 9w is larger than the width of each of the wiring layers 8. The connection portions 9a to 9w are formed integrally with the wiring layers 8, which are connected to the connection portions, respectively.

As shown in FIG. 4, the conductive layers 11 are electrically connected to the sensor member 6 that is disposed on the surface 2b of the flexible base 2.

As shown in, for example, FIGS. 3 and 4, the sensor member 6 includes a plurality of first electrodes 13 that extend in an X direction and are disposed at intervals in a Y direction, and a plurality of second electrodes 14 that extend in the Y direction and are disposed at intervals in the X direction. As shown in FIG. 4, an intermediate base 15 is disposed between the first and second electrodes 13 and 14. Further, a surface base 17 is provided on the surfaces of the second electrodes 14 with an adhesive layer 16 interposed therebetween as shown in FIG. 4, and a surface 17a of the surface base 17 functions as an operation surface. When an operator makes a finger F come into contact with or approach the operation surface 17a, a change in capacitance occurs between the finger F and the first electrode 13 and between the finger F and the second electrode 14. Accordingly, the X-Y coordinates of the finger F can be detected on the basis of the change in capacitance. The sensor member 6 shown in FIG. 3 is a capacitive sensor, and a mutual capacitance detection-type capacitive sensor, a self-capacitance detection-type capacitive sensor, or the like is used as a capacitive sensor that detects the operation position of the finger F. However, a detection method and the structure of electrodes, and the like of the capacitive sensor are not particularly limited. Further, the sensor member 6 may be other sensors (a resistive sensor and the like) except for a capacitive sensor.

The flexible base 2 of this embodiment is a thin base having flexibility, and is formed of a resin sheet or a resin film. For example, the flexible base 2 is a PET (polyethylene terephthalate) film.

It is preferable that the insulating layer 12 formed on the back 2a of the flexible base 2 be a resist layer that is apt to be deformed since having low hardness and high modulus of elasticity as compared to the flexible base 2, for example, a resist layer that is made of photoresist or screen-printed resist.

Further, it is preferable that the wiring layers 8 and the connection portions 9a to 9w formed on the surface of the insulating layer 12 be Ag layers formed by the printing of, for example, Ag ink.

In this embodiment, the electronic components 4 and 5 are disposed on the back 2a of the flexible base 2 as shown in FIG. 1A. However, these electronic components 4 and 5 are mounted on the surface of the printed circuit board 3 of which the area is smaller than the area of the flexible base 2, and the printed circuit board 3 is bonded to the back 2a of the flexible base 2. That is, unlike in a structure where a sensor member is disposed on one surface of a flexible base of an input device in the related art and electronic components are directly mounted on the other surface of the flexible base, the electronic components 4 and 5 are not directly mounted on the flexible base 2.

FIG. 10 is a view seen from a surface 3a of the printed circuit board 3, and wiring layers 20 and terminal portions 21a to 21w, which appear on a back 3b, are shown by a dotted line. Meanwhile, here, the surface 3a of the printed circuit board 3 is the face of the printed circuit board 3 that is seen when the printed circuit board 3 is seen from the side of the back 2a of the flexible base 2 shown in FIG. 1A, and the back 3b of the printed circuit board 3 means the face of the printed circuit board 3 that faces the back 2a of the flexible base 2 (also see FIG. 2).

A plurality of electrode pads 22 are formed on the surface 3a of the printed circuit board 3 as shown in FIG. 10. As shown in FIG. 10, a plurality of terminal portions 21a to 21w and wiring layers 20 extending from the terminal portions 21a to 21w are formed on the back 3b of the printed circuit board 3. Further, the plurality of electrode pads 22 and the plurality of terminal portions corresponding to the electrode pads 22 are electrically connected to each other through the wiring layers 20 and the conductive layers that are filled in the through holes 23 formed at the end portions of the wiring layers 20. The through holes 23 are formed so as to pass through the printed circuit board 3 in a thickness direction.

The wiring layers 20 are formed integrally with the terminal portions 21a to 21w, respectively. Each of the wiring layers 20 and the terminal portions 21a to 21w is obtained by forming patterns with copper foil, and an Au-plated layer or a carbon layer is formed on the surface of each of the terminal portions 21a to 21w. Further, copper foil patterns connected to the terminal portions 21u, 21v, and 21w form a ground layer 25.

The printed circuit board 3 is, for example, a glass epoxy board, and is a rigid board of which the stiffness is higher than the stiffness of the flexible base 2.

A plurality of lead frames 4a are formed on the side surfaces of the electronic component 4 as shown in FIG. 10, and the lead frames 4a are electrically connected to the electrode pads 22 corresponding to the lead frames 4a, respectively. As shown in FIG. 2, a solder layer 24 is provided between each lead frame 4a and each electrode pad 22. A material of the solder layer 24 is not particularly limited, but lead-free low melting point solder is preferably applied as the material of the solder layer 24. Examples of low melting point solder include SnBi, SnBiAg, SnZn, SnZnBi, SnZnIn, SnAgBiIn, SnAgCu, SnAgCuBi, SnIn, and SnBiIn. In FIG. 1, each lead frame 4a and each electrode pad 22 are bonded to each other with the solder layer 24 interposed therebetween. Further, although not shown in FIG. 2, a resin layer may be provided so as to cover the periphery of the solder layers 24 or the lead frames 4a as in Japanese Unexamined Patent Application Publication No. 2010-218535. A material of the resin layer is not particularly limited. However, as the material of the resin layer, for example, an epoxy resin, a phenol resin, a melamine resin, or the like may be selected alone or two or more thermosetting resins may be preferably selected.

However, since the electronic components 4 and 5 are mounted on the rigid printed circuit board 3 in this embodiment, it is possible to appropriately fix the electronic components 4 and 5 to the printed circuit board 3 even though the periphery of the electronic component 4 is not covered with a resin layer if there is no particular problem. Heat treatment temperature in the range of, for example, about 250° C. to 400° C. is required for mounting the electronic components 4 and 5 on the printed circuit board 3. Accordingly, solder is melted, so that the solder layers 24 are formed between the lead frames 4a of the electronic component 4 and the electrode pads 22. As a result, the lead frames 4a are electrically bonded to the electrode pads 22.

Meanwhile, the bonding structure between the lead frames 4a and the electrode pads 22 shown in FIG. 2 is an example, and other structures except for this bonding structure may be applied. Particularly, in this embodiment, the flexible base 2 is not affected by heat when the electronic component 4 is mounted. Accordingly, it is possible to mount the electronic components 4 and 5 on the surface 3a of the printed circuit board 3 with a conductive adhesive such as a thermosetting resin in which a conductive filler except for solder is mixed.

Since the lead frames 4a of the electronic component 4 are electrically connected to the electrode pads 22 of the printed circuit board 3, respectively, the lead frames 4a of the electronic component 4 are electrically connected to the terminal portions connected to the electrode pads 22, respectively.

The connection portions 9a to 9w, which are shown in FIG. 1B and formed on the flexible base 2, correspond to the terminal portions 21a to 21w of the printed circuit board 3, respectively. That is, the connection portions 9a to 9w and the terminal portions 21a to 21w are disposed so as to face each other and overlap each other when the back 3b of the printed circuit board 3 overlaps the back 2a of the flexible base 2.

Meanwhile, the electronic components 4 and 5 may be ICs, ASICs, connectors, capacitors, resistors, or the like, and the kinds thereof are not particularly limited.

Figure 5A:
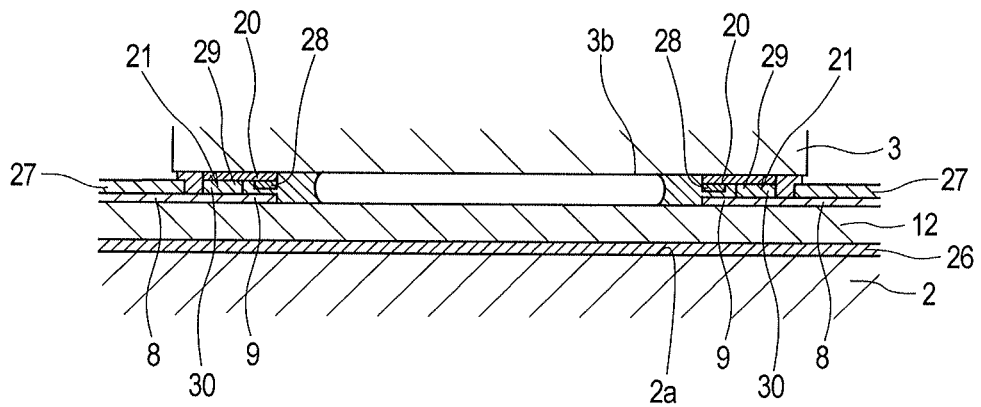
FIG. 5A is a partial longitudinal cross-sectional view of the printed circuit board shown in FIG. 1C, which is bonded to the first surface of the flexible base shown in FIG. 1B, taken along line A-A of FIG. 1C.
Figure 5B:
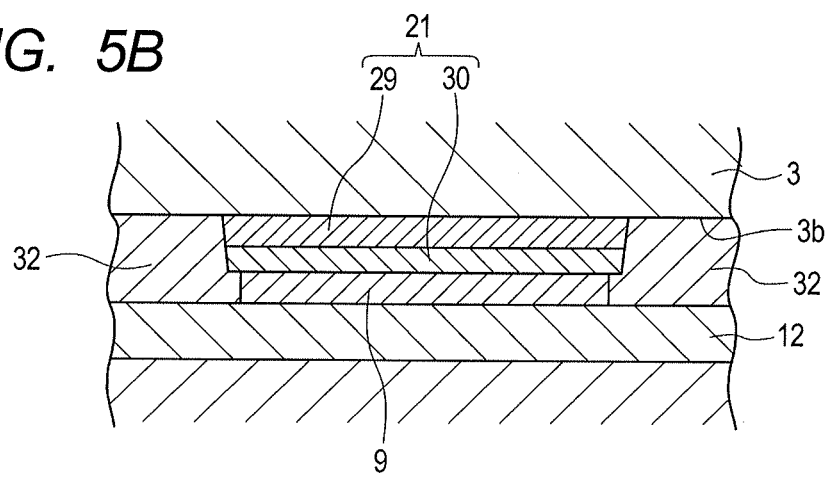
FIG. 5B is a partial longitudinal cross-sectional view of the printed circuit board shown in FIG. 1C, which is bonded to the first surface of the flexible base shown in FIG. 1B, taken along line B-B of FIG. 1C.

FIG. 5A is a partial longitudinal cross-sectional view of the printed circuit board 3 shown in FIG. 1C, which is bonded to the back 2a of the flexible base 2 shown in FIG. 1B, taken along line A-A of FIG. 1C, and FIG. 5B is a partial longitudinal cross-sectional view of the printed circuit board 3 shown in FIG. 1C, which is bonded to the back 2a of the flexible base 2 shown in FIG. 1B, taken along line B-B of FIG. 1C;

As in FIG. 2, the back 2a of the flexible base 2 faces the upper side in FIG. 5.

In an embodiment shown in FIG. 5A, a shield layer 26 is provided on the back 2a of the flexible base 2 and the shield layer 26 contains, for example, carbon. The shield layer 26 can be formed substantially on the entire surface of the back 2a except for the through holes. An insulating layer 12 made of resist is formed on the surface of the shield layer 26. The wiring layers 8 and the connection portions 9a to 9w, which are shown in FIG. 1B, are formed on the surface of the insulating layer 12. Meanwhile, in FIGS. 5A and 5B, the connection portions are denoted by not the respective reference numerals 9a to 9w but reference numeral 9. Further, the terminal portions are also denoted by not the respective reference numerals 21a to 21w but reference numeral 21. As shown in FIG. 5A, insulating protective layers 27 made of resist or the like are provided on the surfaces of the wiring layers 8.

As shown in FIGS. 5A and 5B, the terminal portions 21 and the wiring layers 20 shown in FIG. 1C are formed on the back 3b (the surface that faces the back 2a of the flexible base 2) of the printed circuit board 3. As shown in FIG. 5A, insulating protective layers 28 made of resist or the like are provided on the surfaces of the wiring layers 20.

In this embodiment, as shown in FIGS. 5A and 5B, for example, Cu layers 29 that are formed of integrated copper foil patterns integrated with the wiring layers 20 and the terminal portions 21 are formed and Au-plated layers 30 are formed on the surfaces of the Cu layers 29 at the positions of the terminal portions 21.

As shown in FIGS. 5A and 5B, each connection portion 9 of the flexible base 2 comes into contact with each terminal portion 21 of the printed circuit board 3. Here, it is preferable that "contact" be physical contact, that is, it is preferable that the connection portion 9 come into direct contact with the terminal portion 21. However, this also includes a case where the entire surfaces of each connection portion 9 and each terminal portion 21 do not come into contact with each other and a part thereof come into contact with each other. Further, if electrical signals flow even though each connection portion 9 does not come into physical contact with each terminal portion 21 and an adhesion layer 32 to be described below is interposed between each connection portion 9 and each terminal portion 21 of the printed circuit board 3, this contact is called electrical contact. However, even in such a case, it is preferable that at least a part of each connection portion 9 and each terminal portion 21 come into physical contact with each other.

The adhesion layer 32, which bonds the printed circuit board 3 to the flexible base 2, will be described. It is preferable that the adhesion layer 32 be non-conductive paste (NCP). In this embodiment, the connection portions 9a to 9w of the flexible base 2 come into contact with the terminal portions 21a to 21w of the printed circuit board 3, respectively, and non-conductive paste can be used to bond the printed circuit board 3 to the flexible base 2. The heating temperature of a conductive adhesive material, which is required at the time of bonding, is at least 250° C. or more, but non-conductive paste can perform bonding at a temperature of 140° C. or less. Accordingly, it is possible to appropriately bond the printed circuit board 3 to the flexible base 2 without requiring a large amount of heat unlike a case where a conductive adhesive is used.

Further, it is preferable that the adhesion layer 32 be formed of a moisture-curable adhesive. For example, a material of the adhesion layer 32 is an acrylic modified silicone resin, and the acrylic modified silicone resin causes a hydrolysis/dealcoholization-condensation reaction and is cured as shown in the following chemical formula 1.

Si—OCH$_3$+Si—OH→Si—O—Si+CH$_3$OH    [Chemical formula 1]

The adhesion layer 32 has a function of keeping a constant distance between the flexible base 2 and the printed circuit board 3 by bonding the printed circuit board 3 to the flexible base 2 and a function of maintaining a state where the terminal portions 21a to 21w come into contact with the connection portions 9a to 9w, respectively. That is, even though pressure is removed after the flexible base 2 and the printed circuit board 3 are compressed against each other, a state where the terminal portions 21a to 21w come into contact with the connection portions 9a to 9w, respectively, is maintained well.

In this embodiment, heating and compression are performed as also described in the following manufacturing method when the flexible base 2 and the printed circuit board 3 are bonded to each other by an adhesive. Compression temperature is set to, for example, about 140° C. or less and compression time is set to about 30 sec or less. Meanwhile, temperature during the heating and compression can be set to be lower than heating temperature that is required when bonding is performed using a conductive adhesive. Further, since the thermal deformation temperature of PET is generally about 240° C., it is possible to appropriately suppress the deformation of the flexible base 2 by heating and compression.

Figure 6:
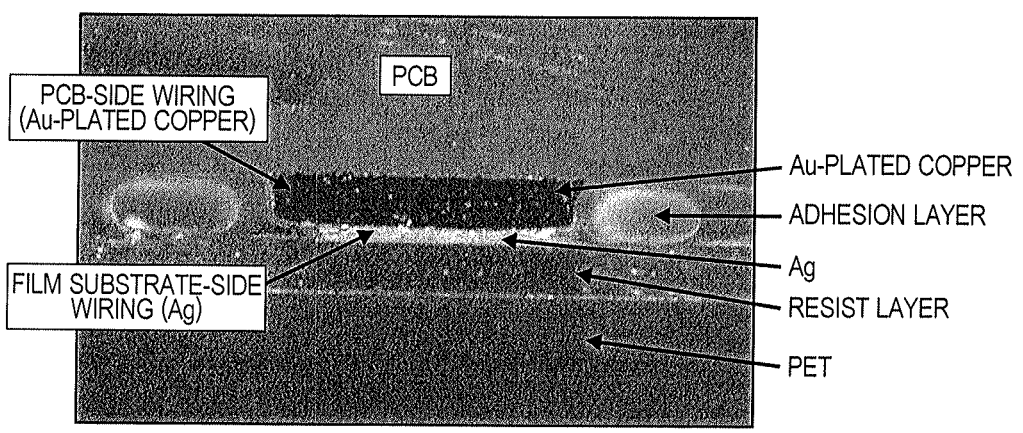
FIG. 6 is a photograph of the cross-section of a bonding portion between the printed circuit board and the PET film (flexible base) shown in FIG. 5B.

FIG. 6 is a photograph of the embodiment shown in FIG. 5B. In FIG. 6, the connection portion (Ag) of the flexible base (PET) and the terminal portion (Au-plated copper) of the printed circuit board (PCB) come into direct contact with each other and there is no adhesive between the connection portion and the terminal portion.

Moreover, the longitudinal cross-sectional shape of each of the terminal portions 21a to 21w shown in FIGS. 5A and 5B and 6 is a substantially rectangular shape, and the contact surfaces of the terminal portions 21a to 21w coming into contact with the connection portions 9a to 9w are formed in a linear shape. The terminal portions 21a to 21w come into surface contact with the connection portions 9a to 9w. In addition, in the embodiment shown in FIGS. 5A and 5B and 6, an Au-plated layer 30 is formed on the surface of each of the terminal portions 21a to 21w. Accordingly, it is possible to effectively reduce the contact resistance between each of the terminal portions 21a to 21w and each of the connection portions 9a to 9w.

In the related art, the electronic component has been directly mounted on the back 2a of the flexible base 2. In such a case, it is not possible to strongly compress the electronic component against the back 2a of the flexible base 2. For this reason, the electronic component has been electrically connected to the connection portions of the flexible base 2 by using a conductive adhesive when being mounted. The conductive adhesive is a thermosetting resin or the like in which solder or a conductive filler is mixed, and requires a high-temperature heat treatment. Accordingly, the thermal influence of the high-temperature heat treatment has caused the deformation of the flexible base 2.

In contrast, in this embodiment, the electronic components 4 and 5 are mounted on the printed circuit board 3 of which the area is smaller than the area of the flexible base 2 and are not directly mounted on the flexible base 2. Accordingly, the flexible base 2 is not affected by heat that is required for mounting the electronic components 4 and 5 on the printed circuit board 3. Further, in this embodiment, the flexible base 2 and the printed circuit board 3 are bonded to each other by the adhesion layer 32 so that the connection portions 9a to 9w of the flexible base 2 come into contact with the terminal portions 21a to 21w of the printed circuit board 3, respectively. Since the connection portions 9a to 9w come into contact with the terminal portions 21a to 21w as described above in this embodiment, a conductive adhesive requiring a high-temperature heat treatment does not need to be used to electrically connect the connection portions 9a to 9w to the terminal portions 21a to 21w. In this embodiment, the electronic components 4 and 5 are not directly mounted on the flexible base 2 and the printed circuit board 3 on which the electronic components 4 and 5 have been mounted is bonded to the flexible base 2. In particular, since the positions of the connection portions 9a to 9w and the terminal portions 21a to 21w to be compressed are present around the electronic components 4 and 5 outside the electronic components 4 and 5 as shown in FIGS. 1B and 1C, it is possible to strongly compress the connection portions 9a to 9w against the terminal portions 21a to 21w without applying a compression force to the electronic components 4 and 5. Accordingly, even though a conductive adhesive is not used, it is possible to bring the connection portions 9a to 9w into contact with the terminal portions 21a to 21w, respectively. The adhesive is extruded to the periphery of the bonding portion between the connection portions 9a to 9w and the terminal portions 21a to 21w by the force that is applied at this time. As a result, the flexible base 2 and the printed circuit board 3 are bonded to each other by the adhesion layer 32.

As described above, in this embodiment, it is possible to suppress the deformation of the flexible base 2, which is caused by heat, as compared to the related art. Further, since the printed circuit board 3 overlaps a part of the flexible base 2, the flexibility of a portion of the flexible base 2, which does not overlap the printed circuit board 3, does not deteriorate. Accordingly, it is possible to form the flexible base 2 in a curved shape to form an input device.

Figure 7:
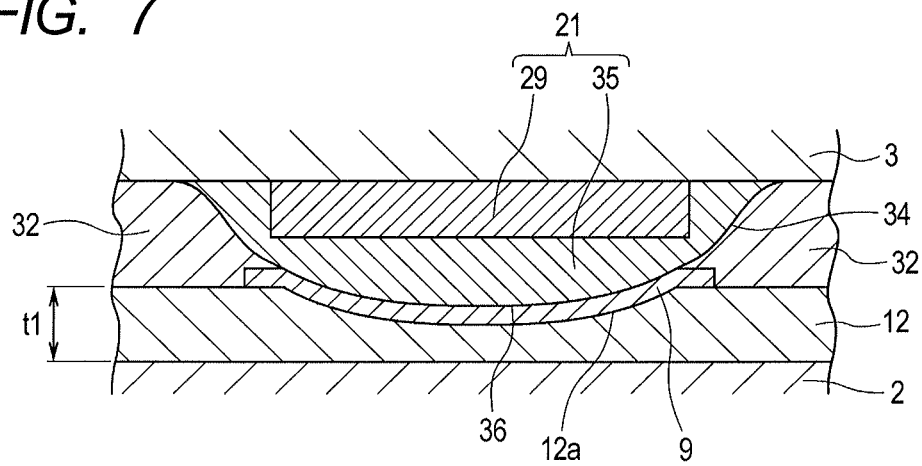
FIG. 7 is a partial longitudinal cross-sectional view of a bonding portion between a printed circuit board and a flexible base different from those of FIG. 5B.
Figure 8:
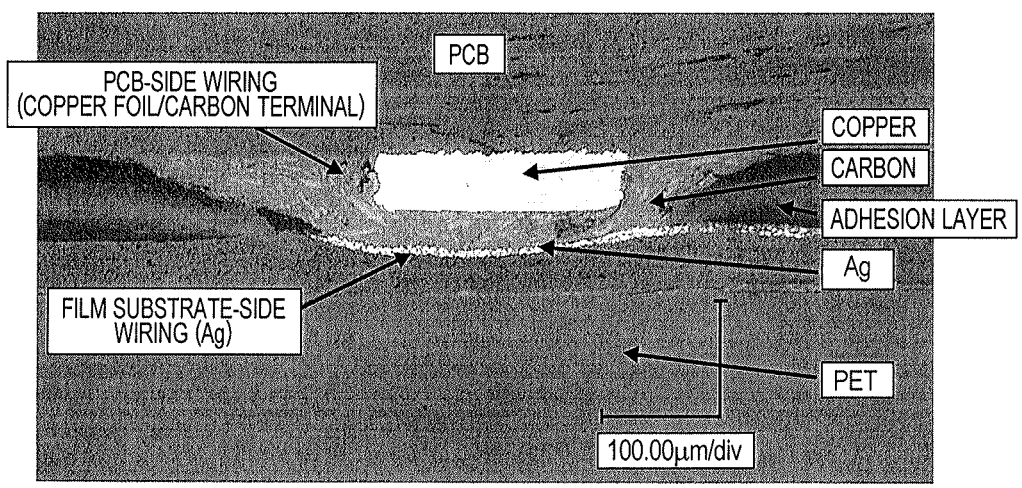
FIG. 8 is a photograph of the cross-section of the bonding portion between the printed circuit board and the PET film (flexible base) shown in FIG. 7.

FIG. 7 is a partial longitudinal cross-sectional view of a bonding portion between a printed circuit board and a PET film (flexible base) different from those of FIG. 5B, and FIG. 8 is a photograph of the cross-section of the bonding portion between the printed circuit board and the PET film (flexible base) shown in FIG. 7.

In FIG. 7, a surface 34 of the terminal portion 21 that appears in the longitudinal cross-sectional shape is formed in a convex-curved shape unlike in FIG. 5B. In FIG. 7, the terminal portion 21 includes a Cu layer 29 that is formed of a copper foil pattern and a carbon layer 35. Further, the surface of the carbon layer 35 forms the convex-curved surface 34 of the terminal portion 21.

Even in an embodiment of FIG. 8, the terminal portion 21 and the connection portion 9 come into direct contact with each other and the adhesion layer 32 is not interposed between the terminal portion 21 and the connection portion 9.

In the embodiment shown in FIGS. 7 and 8, the surface 34 of the terminal portion 21, which is the surface of the carbon layer 35, is formed in a convex-curved shape and a surface 12a of the insulating layer 12 and a surface 36 of the connection portion 9, which face the terminal portion 21 in the height direction, are recessed and deformed along the shape of the surface 34 of the terminal portion 21.

Further, an adhesive is extruded to the side of the bonding portion between the terminal portion 21 and the connection portion 9 in FIGS. 7 and 8, so that the adhesion layer 32 bonds the printed circuit board 3 to the flexible base 2.

As shown in FIGS. 7 and 8, the insulating layer 12 functions as a cushion layer (stress absorbing layer) when the flexible base 2 and the printed circuit board 3 are compressed against each other. Accordingly, the insulating layer 12 and the connection portion 9 are pressed by the terminal portion 21 and are recessed at the time of compression, so that a force applied at the time of compression can be effectively absorbed by the insulating layer 12. As a result, it is possible to hinder the force, which is applied at the time of compression, from being applied to the flexible base 2 itself. Therefore, it is possible to suppress the deformation of the flexible base 2. Since the surface 34 of the terminal portion 21 is formed in a convex-curved shape in the embodiment shown in FIGS. 7 and 8, the surface 12a of the insulating layer 12 and the surface 36 of the connection portion 9 can be moderately recessed and deformed along the shape of the surface 34 of the terminal portion 21.

Meanwhile, even in FIG. 5B, the surface 12a of the insulating layer 12 and the surface 36 of the connection portion 9 can be recessed and deformed as shown in FIG. 7.

Since the surfaces 12a and 36 of the insulating layer 12 and the connection portion 9 are recessed and deformed along the shape of the surface 34 of the terminal portion 21 as shown in FIGS. 7 and 8, it is possible to increase the contact area between the connection portion 9 and the terminal portion 21. As a result, it is possible to reduce contact resistance. The contact resistance changes depending on the contact area or a material. Further, each of the terminal portion 21 and the connection portion 9 may form a flat surface as shown in FIG. 5B without being recessed and deformed. Meanwhile, when the surface of the terminal portion 21 is formed of the Au layer shown in FIGS. 5B and 6 as a material of the terminal portion 21, it is possible to reduce contact resistance as compared to a case where the surface of the terminal portion 21 is formed of the carbon layer 35. Furthermore, it is possible to reduce contact resistance by increasing the thickness t1 (see FIG. 7) of the insulating layer 12. Accordingly, it is possible to reduce contact resistance.

Moreover, in FIGS. 7 and 8, the connection portion 9 and the terminal portion 21 come into contact with each other while the surface 12a of the insulating layer 12 and the surface 36 of the connection portion 9 are recessed and deformed, and the adhesive is cured. When the force, which is applied to compress the flexible base 2 against the printed circuit board 3, is released (removed), the terminal portion 21 is lifted by the restoring forces of the insulating layer 12 and the connection portion 9. At this time, if the curing has proceeded so as to overcome the restoring forces, the recessing and deformation of the surfaces 12a and 36 of the insulating layer 12 and the connection portion 9 are maintained. Accordingly, it is possible to keep the large contact area between the terminal portion 21 and the connection portion 9 with no change. Meanwhile, if the adhesive is not sufficiently cured and the adhesion layer 32 is in a soft state, the recessing and deformation of the surfaces 12a and 36 of the insulating layer 12 and the connection portion 9 are apt to return to the original state. Accordingly, the contact area between the terminal portion 21 and the connection portion 9 is reduced, so that a conduction state is apt to be unstable. For this reason, the flexible base 2 and the printed circuit board 3 need to be heated and compressed against each other, and it is necessary to sufficiently cure the adhesion layer 32 by appropriately adjusting the temperature or time at this time. For example, the temperature during the heating and compression is set to about 140° C. or less and compression time is set to about 30 sec or less. Accordingly, the temperature during the heating and compression can be set to be lower than the heating temperature that is required when bonding is performed using a conductive adhesive, and can be set to be lower than the thermal deformation temperature of the flexible base 2. Therefore, it is possible to appropriately suppress the deformation of the flexible base 2 by heating and compression.

In this embodiment, a board supporting the electronic components 4 and 5 may not be the printed circuit board 3. However, since the printed circuit board 3 is more rigid than the flexible base 2 that is being used, it is possible to simply and appropriately mount the electronic components 4 and 5 on the printed circuit board 3. Further, since the printed circuit board 3 is not prepared so as to correspond to the number of the electronic components 4 and 5 and the printed circuit board 3 on which the plurality of electronic components 4 and 5 have been mounted is bonded to the back 2a of the flexible base 2 in this embodiment, the mounting of the plurality of electronic components 4 and 5 is simple. Furthermore, it is possible to set the area of the printed circuit board 3 to the minimum and to set the flexible area of the flexible base 2 to a sufficiently wide area. Meanwhile, in this embodiment, one printed circuit board 3 is bonded to the back 2a of the flexible base 2. However, a plurality of printed circuit boards 3 may be bonded to the back 2a of the flexible base 2.

The input device 1 has been described in this embodiment. However, a structure where the printed circuit board 3 and the electronic components 4 and 5 are provided on the first surface (back) 2a of the flexible base 2 is essential and there is a choice to select the structure of the second surface 2b of the flexible base 2. That is, the sensor member 6 may not be disposed on the second surface 2b of the flexible base 2. However, if the sensor member 6 is disposed on the surface of the flexible base 2 and the electronic components 4 and 5 are mounted on one of the surface and the back of the flexible base 2 and integrated as described in this embodiment, it is possible to make the input device 1, which can detect the operation position of an operation body, flexible.

Meanwhile, in the "mounting structure for an electronic component" described in this embodiment, the printed circuit board 3 and the electronic components 4 and 5 are provided on the first surface (back) 2a of the flexible base 2 (the structure on the second surface is not particularly defined). Further, the "input device 1" has the structure where the sensor member 6 is provided on the second surface 2b of the flexible base 2.

A method of manufacturing the input device 1 of this embodiment will be described with reference to FIGS. 9 and 10.

First of all, the electronic components 4 and 5 are mounted on the surface of the printed circuit board 3 of which the area is smaller than the area of the flexible base 2 as shown in FIGS. 1A, 1C, and 2. A mounting method may be a method in the related art and is not particularly limited. For example, the lead frames 4*a* of the electronic component 4 are soldered to the electrode pads 22 of the printed circuit board 3, respectively. Alternatively, the lead frames 4*a* may be electrically bonded to the electrode pads 22, respectively, by using a thermosetting resin in which a conductive filler is mixed.

Figure 9:
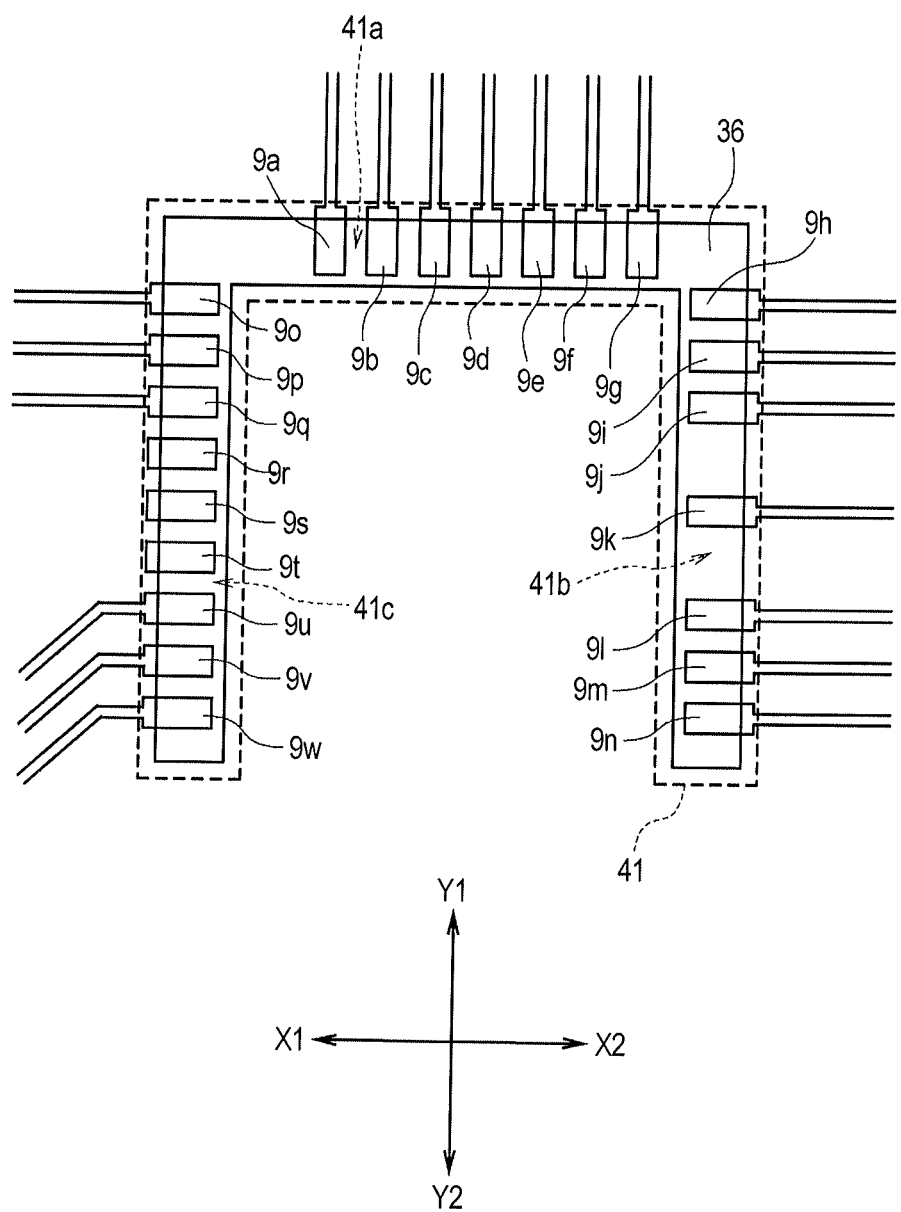
FIG. 9 is a view (partial plan view) illustrating a process for manufacturing a mounting structure for an electronic component and an input device of this embodiment.

An adhesive is applied to the surfaces 36 of the connection portions 9*a* to 9*w* that are formed on the back 2*a* of the flexible base 2 as shown in FIG. 9 by a dispenser. Further, the adhesive is continuously applied to the gaps between the surfaces 36 of the connection portions 9*a* to 9*w* and the connection portions 9*a* to 9*w*. The adhesive is applied to only regions that are required for bonding the printed circuit board 3 to the flexible base 2. It is preferable that the adhesive be non-conductive paste (NCP). Furthermore, it is preferable that a moisture-curable adhesive be used as the adhesive. Accordingly, it is possible to appropriately bond the printed circuit board 3 to the flexible base 2 without requiring a large amount of heat when the flexible base 2 and the printed circuit board 3 are heated and compressed against each other.

Next, while the flexible base 2 (the sensor member 6 is not shown) is installed on the fixed table 40 and the terminal portions 21 of the printed circuit board 3 face the connection portions 9 of the flexible base 2 in the height direction as shown in FIG. 10A, a compression head 41 is installed on the face 3*b* opposite to the face 3*a* of the printed circuit board 3 on which the terminal portions 21 are formed. The compression head 41 is exactly disposed in a region where the connection portions 9 face the terminal portions 21, and does not come into contact with the electronic components 4 and 5. For example, the compression head 41 is formed to have a planar shape slightly larger than the region shown in FIG. 9 to which the adhesive is applied (see a dotted line of FIG. 9).

Further, the printed circuit board 3 and the flexible base 2 are heated and compressed against each other by the compression head 41. At this time, the compression head 41 is set to a predetermined temperature. For example, the temperature of the compression head 41 is set in the range of about 60° C. to 140° C.

When pressure is applied between each terminal portion 21 and each connection portion 9, the adhesive applied to the surface 36 of each connection portion 9 is extruded to the side, so that the terminal portions 21 come into contact with the connection portions 9. The adhesive is kept at the above-mentioned compression temperature of about 60° C. to 140° C. and for a compression time of about 10 to 30 sec, so that the curing reaction of the adhesive proceeds. The compression temperature in this case is sufficiently lower than the heating temperature that is required for mounting the electronic components 4 and 5 on the printed circuit board 3 by with a conductive adhesive interposed therebetween. Meanwhile, the heating temperature, which is required for mounting the electronic components 4 and 5 on the printed circuit board 3, is in the range of about 250° C. to 400° C. Further, the compression temperature in this embodiment is set to a temperature lower than the thermal deformation temperature of the flexible base 2. Accordingly, it is possible to effectively suppress the thermal deformation of the flexible base 2. The thermal deformation temperature is an index that shows the heat resistance of the flexible base 2. The thermal deformation temperature is a deflection temperature under load, and can be determined by test methods, such as ASTM-D648 and JIS7191.

Moreover, the adhesive is cured by the heating and compression, and the flexible base 2 and the printed circuit board 3 are bonded to each other by the adhesion layer 32 so that the connection portions 9 come into contact with the terminal portions 21 (FIG. 10B).

Subsequently, the compression head 41 is removed. Accordingly, pressure, which is applied between the connection portions 9 and the terminal portions 21, is released, but the connection portions 9 and the terminal portions 21 are appropriately kept so as to come into contact with each other since the adhesion layer 32 interposed between the flexible base 2 and the printed circuit board 3 is sufficiently cured.

Further, the insulating layer (resist) 12, which is formed on the back 2*a* of the flexible base 2, functions as a cushion layer (stress absorbing layer). The compression head 41 shown in FIG. 10A is moved down to bring the terminal portions 21 into contact with the connection portions 9 and to recess and deform the surface 12*a* of the insulating layer 12 and the surfaces 36 of the connection portions 9 that face the terminal portions 21 in the height direction. Accordingly, it is possible to effectively absorb the applied force by a portion of the insulating layer 12, so that it is possible to reduce the influence of the force applied to the flexible base 2 during the heating and compression. Therefore, it is possible to appropriately suppress the deformation of the flexible base 2. Furthermore, as shown in FIGS. 7 and 8, the surfaces 36 and 12*a* of the connection portions 9 and the insulating layer 12 are recessed and deformed along the shapes of the surfaces 34 of the terminal portions 21. Accordingly, it is possible to increase the contact area between the terminal portions 21 and the connection portions 9, so that it is possible to reduce contact resistance. Meanwhile, if the adhesion layer 32 is not sufficiently cured, the insulating layer 12 and the connection portions 9, which are recessed by the heating and compression, are apt to return to the original state when the compression head 41 is removed. Accordingly, since the state where the terminal portions 21 come into contact with the connection portions 9 becomes unstable, it is important to sufficiently cure the adhesion layer 32 by appropriately adjusting the compression temperature or the compression time during the heating and compression.

According to the method of manufacturing the input device 1 of this embodiment, the electronic components 4 and 5 are mounted on the printed circuit board 3 without being directly mounted on the flexible base 2. Accordingly, heat required for mounting the electronic components 4 and 5 does not affect the flexible base 2. The flexible base 2 and the printed circuit board 3 are compressed against each other in this embodiment, so that the terminal portions 21 of the printed circuit board 3 come into contact with the connection portions 9 of the flexible base 2 and the flexible base 2 and the printed circuit board 3 are bonded to each other by the adhesion layer 32. Since the terminal portions 21 and the connection portions 9 are compressed against each other, a conductive adhesive does not need to be used for the electrical connection between the terminal portions 21 and the connection portions 9. Accordingly, a large amount of heat, which is required when a conductive adhesive is used to bond the printed circuit board 3 to the flexible base 2, is not needed. Therefore, it is possible to suppress the deformation of the flexible base 2 that is caused by heat as compared to the related art. Since the printed circuit board 3 of which the area is smaller than the area of the flexible base 2 is used, the flexibility of the flexible base 2 does not deteriorate.

When an electronic component is directly mounted on the flexible base 2 as in the related art, the lead frames of the electronic component are bonded to the connection portions of the flexible base by soldering and the periphery of the electronic component is covered with, for example, a thermosetting resin so that the electronic component can be appropriately and reliably fixed to the flexible base 2. In such a case, the thermosetting resin covering the electronic component covers not only the side surfaces of the electronic component but also the surface of the electronic component. Accordingly, the sum of the thickness of the flexible base 2 and the thickness of the thermosetting resin becomes the total thickness.

In contrast, since the printed circuit board 3 is interposed between the flexible base 2 and the electronic components 4 and 5 in this embodiment, the sum of the thickness of the flexible base 2, the thickness of the electronic components 4 and 5, and the thickness of the printed circuit board 3 becomes the total thickness. However, in this embodiment, the sum of the thickness of the electronic components 4 and 5 and the thickness of the printed circuit board 3 is substantially equal to the thickness of the thermosetting resin in the related art. Accordingly, it is possible to reduce the total thickness so that the total thickness is equal to the thickness of the structure in the related art where the electronic component is directly mounted on the flexible base.

A material of the flexible base 2 is not limited, and a PI film, a PEN film, and the like may be used as the flexible base. However, in this embodiment, a PET film can be preferably applied. It is possible to manufacture an input device, which has flexibility, at low cost by using a PET film that is inexpensive and has flexibility. Further, trouble where the flexible base is deformed by heat required for mounting has been apt to occur in a structure where an electronic component is directly mounted on the flexible base as in the related art. However, even though a PET film, which is inferior to a PI film or the like in terms of heat resistance, is used in this embodiment, the electronic components 4 and 5 are mounted on the printed circuit board 3 of which the area is smaller than the area of the PET film without being directly mounted on a PET film and the printed circuit board 3 is bonded to the PET film. Accordingly, heat, which is required for mounting the electronic components 4 and 5 on the printed circuit board 3, does not affect the PET film. As a result, it is possible to suppress the deformation of the PET film as compared to the related art.

It should be understood by those skilled in the art that various modifications, combinations, sub-combinations and alterations may occur depending on design requirements and other factors insofar as they are within the scope of the appended claims of the equivalents thereof.

What is claimed is:

1. A mounting structure for an electronic component, the mounting structure comprising:
   a flexible base;
   a connection portion that is provided on a first surface of the flexible base;
   a board of which an area is smaller than an area of the flexible base and stiffness is higher than the stiffness of the flexible base and which includes a terminal portion on the surface thereof facing the first surface;
   an electronic component that is mounted on a surface of the board opposite to the surface of the board on which the terminal portion is provided, and is electrically connected to the terminal portion,
   wherein the flexible base and the board are bonded to each other with an adhesion layer interposed therebetween so that the connection portion and the terminal portion come into contact with each other; and
   a sensor member provided on a second surface of the flexible base opposite to the first surface and detects an operation position of an operation body.

2. The mounting structure for an electronic component according to claim 1,
   wherein an insulating layer is provided on the first surface of the flexible base, the connection portion is provided on the surface of the insulating layer, and a surface of the terminal portion that appears in a longitudinal cross-sectional shape is formed in a convex-curved shape.

3. The mounting structure for an electronic component according to claim 1,
   wherein the longitudinal cross-sectional shape of the terminal portion is a rectangular shape, and an Au layer is disposed on a surface of the terminal portion.

4. The mounting structure for an electronic component according to claim 1,
   wherein the adhesion layer comprises a non-conductive paste.

5. The mounting structure for an electronic component according to claim 1,
   wherein the adhesion layer comprises a moisture-curable adhesive.

6. The mounting structure for an electronic component according to claim 1,
   wherein the curing temperature of the adhesion layer is lower than the thermal deformation temperature of the flexible base.

7. The mounting structure for an electronic component according to claim 1,
   wherein the flexible base comprises a PET film.

8. The mounting structure for an electronic component according to claim 1,
   wherein a plurality of the electronic components are mounted on the same board.

9. The mounting structure for an electronic component according to claim 2,
   wherein the insulating layer comprises a resist layer.

10. The mounting structure for an electronic component according to claim 2,
    wherein a carbon layer is disposed on the surface of the terminal portion.

11. An input device comprising:
    a mounting structure for an electronic component comprising:
    a flexible base;
    a connection portion that is provided on a first surface of the flexible base;
    a board of which an area is smaller than an area of the flexible base and stiffness is higher than the stiffness of the flexible base and which includes a terminal portion on the surface thereof facing the first surface; and
    an electronic component that is mounted on a surface of the board opposite to the surface of the board on which the terminal portion is provided, and is electrically connected to the terminal portion,
    wherein the flexible base and the board are bonded to each other with an adhesion layer interposed therebetween so that the connection portion and the terminal portion come into contact with each other; and
    a sensor member provided on a second surface of the flexible base opposite to the first surface and detects an operation position of an operation body.

12. A method of manufacturing a mounting structure for an electronic component by using a flexible base that includes a connection portion provided on a first surface thereof, a board of which an area is smaller than an area of the flexible base and stiffness is higher than the stiffness of the flexible base and which includes a terminal portion on a surface thereof facing the first surface, and an electronic component; and a sensor member provided on a second surface of the flexible base opposite to the first surface and detects an operation position of an operation body, the method comprising the steps of:

electrically connecting the electronic component to the terminal portion by mounting the electronic component on a surface of the board opposite to the surface of the board on which the terminal portion is provided;

applying an adhesive to the first surface of the flexible base; and bonding the board to the flexible base with an adhesion layer interposed therebetween by compressing the board against the flexible board so that the terminal portion of the board and the connection portion of the flexible base face each other and the connection portion comes into contact with the terminal portion.

13. The method according to claim 12,
wherein an insulating layer is formed on the first surface of the flexible base and the connection portion is formed on the surface of the insulating layer, and
a portion of the insulating layer facing the terminal portion in a height direction and the surface of the connection portion are recessed and deformed by the compressing of the board.

14. The method according to claim 12,
wherein the board and the flexible base are heated and compressed against each other at a temperature lower than the thermal deformation temperature of the flexible base.

15. The method according to claim 12,
wherein non-conductive paste is used as the adhesive.

16. The method according to claim 12,
wherein a moisture-curable adhesive is used as the adhesive.

17. The method according to claim 12,
wherein a PET film is used as the flexible base.

18. A method of manufacturing a mounting structure for an electronic component by using a flexible base that includes a connection portion provided on a first surface thereof, a board of which an area is smaller than an area of the flexible base and stiffness is higher than the stiffness of the flexible base and which includes a terminal portion on a surface thereof facing the first surface, and an electronic component the method comprising the steps of:

electrically connecting the electronic component to the terminal portion by mounting the electronic component on a surface of the board opposite to the surface of the board on which the terminal portion is provided;

applying an adhesive to the first surface of the flexible base; and bonding the board to the flexible base with an adhesion layer interposed therebetween by compressing the board against the flexible board so that the terminal portion of the board and the connection portion of the flexible base face each other and the connection portion comes into contact with the terminal portion; and providing a sensor member on a second surface of the flexible base opposite to the first surface and detects an operation position of an operation body.

\* \* \* \* \*